United States Patent [19]

Rapp

[11] Patent Number: 5,424,997

[45] Date of Patent: Jun. 13, 1995

[54] NON-VOLATILE SEMICONDUCTOR MEMORY HAVING SWITCHING DEVICES FOR SEGMENTATION OF A MEMORY PAGE AND A METHOD THEREOF

[75] Inventor: A. Karl Rapp, Los Gatos, Calif.

[73] Assignee: National Semiconductor Corporation, Del.

[21] Appl. No.: 213,902

[22] Filed: Mar. 15, 1994

[51] Int. Cl.⁶ .............................................. G11C 7/00
[52] U.S. Cl. ............................ 365/238.5; 365/189.05; 365/220; 365/230.03; 365/185
[58] Field of Search ............... 365/189.05, 220, 230.03, 365/238.5, 185

[56] References Cited

U.S. PATENT DOCUMENTS

| | | | |
|---|---|---|---|
| 4,598,388 | 7/1986 | Anderson | 365/200 |
| 4,608,670 | 8/1986 | Duvvury et al. | 365/205 |
| 4,636,987 | 1/1987 | Norwood et al. | 365/208 |
| 4,691,301 | 9/1987 | Anderson | 365/200 |
| 4,953,129 | 8/1990 | Kobayashi et al. | 365/203 |
| 5,267,215 | 11/1993 | Tsujimoto | 365/230.03 |
| 5,293,350 | 3/1994 | Kim et al. | 365/238.5 |
| 5,323,351 | 6/1994 | Challa | 365/218 |
| 5,355,347 | 10/1994 | Cioaca | 365/230.08 |

Primary Examiner—Joseph A. Popek
Assistant Examiner—Andrew Q. Tran
Attorney, Agent, or Firm—Limbach & Limbach; H. Donald Nelson; Stephen R. Robinson

[57] ABSTRACT

In order to permit the selection of aspect ratio for a given memory size, a semiconductor array utilizes switches to segment bit line columns, where each segment is associated with a specific set of memory locations and their respective data latches. After all of the data latches are loaded, the switches segment the bit line columns to allow simultaneous programming of those memory locations cells associated with each set of data latches. This sequence is repeated until all desired data storage cells are programmed.

2 Claims, 6 Drawing Sheets

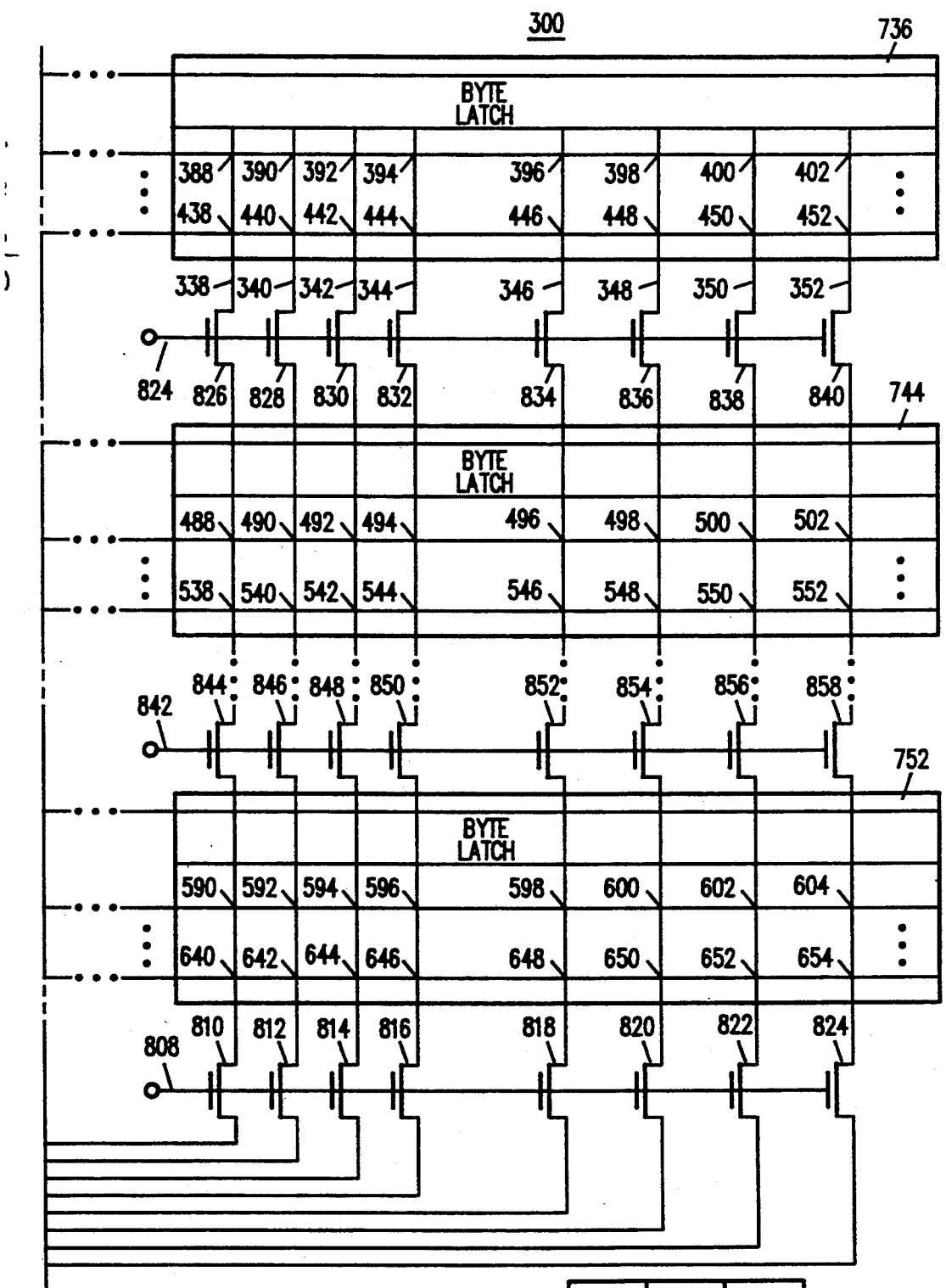
FIG. 3C
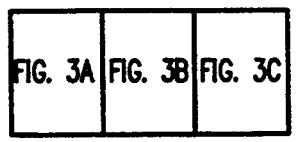
KEY TO FIG. 3

NON-VOLATILE SEMICONDUCTOR MEMORY HAVING SWITCHING DEVICES FOR SEGMENTATION OF A MEMORY PAGE AND A METHOD THEREOF

BACKGROUND OF THE INVENTION

1. Field of the Invention

The present invention relates to non-volatile memory devices and, in particular, to a non-volatile memory which utilizes switching devices to permit segmentation of a memory "page" into multiple word lines.

2. Description of the Prior Art

Many non-volatile memories are organized in "X 8" configuration arrays, wit access to memory locations within an array provided on an individual byte basis. A group of bytes, commonly referred to as a "page" can be programmed simultaneously after data latches for an entire page have been sequentially loaded byte by byte. The number of bytes within a page normally is limited to the number of bytes along a word line or to a subset of such number.

The dimensions of a non-volatile memory array, particularly its aspect ratio (the ratio of length to width), determine the length of the word lines within a memory of a selected size, and thus set the maximum page size.

FIGS. 1A and 1B combine to show a typical prior art non-volatile memory array 10. The array 10 is "subdivided" into N sets of 8-bit bytes, i.e., Byte 1–Byte N in FIGS. 1A–1B, each byte including 8 bit lines. That is, Byte 1 includes bit lines 14–28, Byte 2 includes bit lines 30–44, and Byte N includes bit lines 46–60.

The array 10 further includes a plurality of word line running transverse to and intersecting the bit lines of the array 10 to define the memory cell locations of the array 10. For example, as shown in FIGS. 1A and 1b, one such word line, word line 12, intersects each set of bit lines 14–28, 30–44 and 46–60 to define corresponding memory locations 62–76 (as a first byte), 78–92 (as a second byte), and 94–108 (as a Nth byte), respectively. Those skilled in the an will appreciate that for purposes of illustration, only three bytes are described; however, additional bytes may be included within the memory array 10. The intersections of the multiple word lines and a common bit line define a column of memory cells locations in the array 10.

The array 10 also includes a first column-select line 110 that is connected in common to the gate of each of column-select transistors 112–126 associated with the Byte 1 bit lines 14–28. A second column-select line 128 is connected in common to the gate of each of column-select transistors 130–144 associated with the Byte 2 bit lines 30–44. Similarly, a Nth column-select line 146 is connected in common to the gate of each of column-select transistors 148–162 associated with the Byte N bit lines 46–60.

Referring now to FIGS. 1A and 1B and to FIG. 2, a byte latch 164 contained within and associated with Byte 1 contains eight separate data latches 166–180 (as illustrated in FIG. 2). Similarly, although not shown in FIG. 2, a byte latch 182 associated with Byte 2 and a byte latch 184 associated with Byte N, each contain eight separate data latches.

FIGS. 1A and 1B also show another of the plurality of word lines in the array 10, namely word line 186, intersecting the bit lines 14–60 to form memory locations 188–202 (as a first byte), 204–218 (as a second byte), and 220–234 (as an Nth byte). It is to be understood that although only two word lines 12 and 186 are illustrated, the bit lines 14–60 are typically associated with a number of word lines, generally groups of word lines with the group size being a power of two ($2^x$). These additional word lines are represented in FIGS. 1A and 1B by the conventional "three dot" nomenclature shown between word 12 and word line 186. Thus, each of the individual data latches 166–180 of Byte 1 is associated with the selected memory location at the intersection of the selected word line and a bit line which is coupled to that particular data latch. Similarly, each of the eight separate data latches within each byte 182 and 184 is associated with corresponding multiple memory locations, although only two memory locations for each bit line are illustrated in FIGS. 1A and 1B.

In the operation of the array 10, a column-select signal applied to column-select line 110 turns on column-select transistors 112–126 to thereby connect bit lines 14–28 to input/output lines 236–250, respectively. An active load signal is provided to a strobe line 252 to simultaneously strobe the byte latches 164, 182 and 184 for Bytes 1, 2 and N, respectively. Since the active column-select signal is present only at column-select line 110 and not at column-select lines 128 and 146, a column-select gate ensures that data from the input/output lines 236–250 are loaded only into the byte latch 164 associated with Byte 1. The column-select signal is then removed from the first column-select line 110 and applied to the second column-select line 128, turning on column-select transistors 130–144 to thereby connect bit lines 30–44 to input/output lines 236–250. A load signal is again provided to strobe line 252 to simultaneously strobe byte latches 164, 182 and 184. A column-select gate within byte latch 182 ensures that data at the input/output lines 236–250 are loaded only into the byte latch 182 associated with Byte 2. This sequential loading continues until the column-select signal is applied to the Nth column-select line 146 to thereby turn on column-select transistors 148–162. Together with a load signal on the strobe line 252, this allows the loading of data from the input/output lines 236–250 into byte latch 184 associated with Byte N. Thus, data are sequentially loaded into the byte latches 164, 182 and 184 one byte at a time.

After all of the byte latches 164, 182 and 184 have been loaded and the column-select transistors 112–126, 130–144 and 148–162 are turned off, the word line 12 is selected and data within the byte latches 164, 182 and 184 are simultaneously programmed into memory locations 62–76, 78–92 and 94–108, respectively. The above sequence may then be repeated with new data which are sequentially loaded into each of the byte latches 164, 182 and 184. When the byte latches have been loaded and the column-select transistors 112–126, 130144 and 148–162 have been turned off, a different word line, for example word line 186, is strobed to thereby simultaneously program data from byte latches 164, 182 and 184 into the memory locations 188–202, 204–218 and 220–234, respectively.

The data stored at a given word-line location are referred to as a "page". The maximum page size (number of bytes at each word-line location) can be constrained by the physical dimensions of a memory array of a given size. The ratio of page size to number of pages (bit-line length) is limited by the manufacturability of integrated-circuit die with extreme aspect ratio (ratio of die width-to-length ratio). Therefore, it would be desireable to provide a method and apparatus which will not limit the selection of page length for a given total memory size.

SUMMARY OF THE INVENTION

The present invention is directed to a memory architecture which does not limit page size for a given memory size.

The methods and apparatus of the invention provide a memory having large page size by using continuous bit line columns to allow the successive loading of data into multiple banks of data latches. After data have been loaded into data latches, switches segment the bit line columns to allow the simultaneous programming of the loaded data into the memory locations associated with each data latch in each bank.

Thus, the invention permits the selection of page size for a memory by simultaneously utilizing two or more word lines in place of a single word line.

The above features and advantages of the present invention will become apparent from the following description and the appended claims taken in conjunction with the accompanying drawings in which like pans or elements are denoted by like reference numerals.

BRIEF DESCRIPTION OF THE DRAWING

FIGS. 3A, 3B and 3C combine to provide a layout drawing illustrating a memory array architecture in accordance with the present invention.

DETAILED DESCRIPTION OF THE INVENTION

Figure 1A:
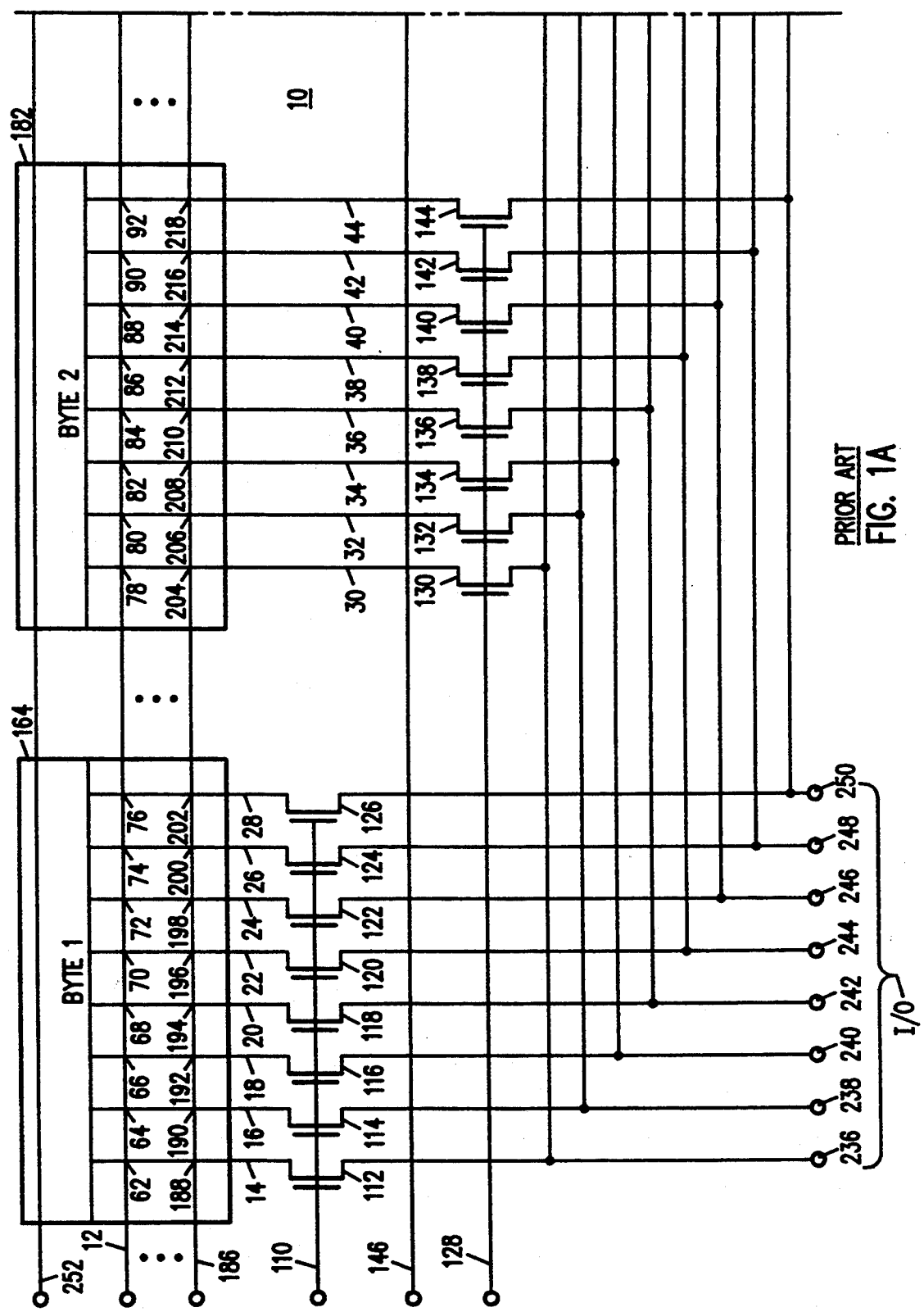
FIGS. 1A and 1B combine to provide a layout drawing illustrating a prior an memory array architecture.
Figure 1B:
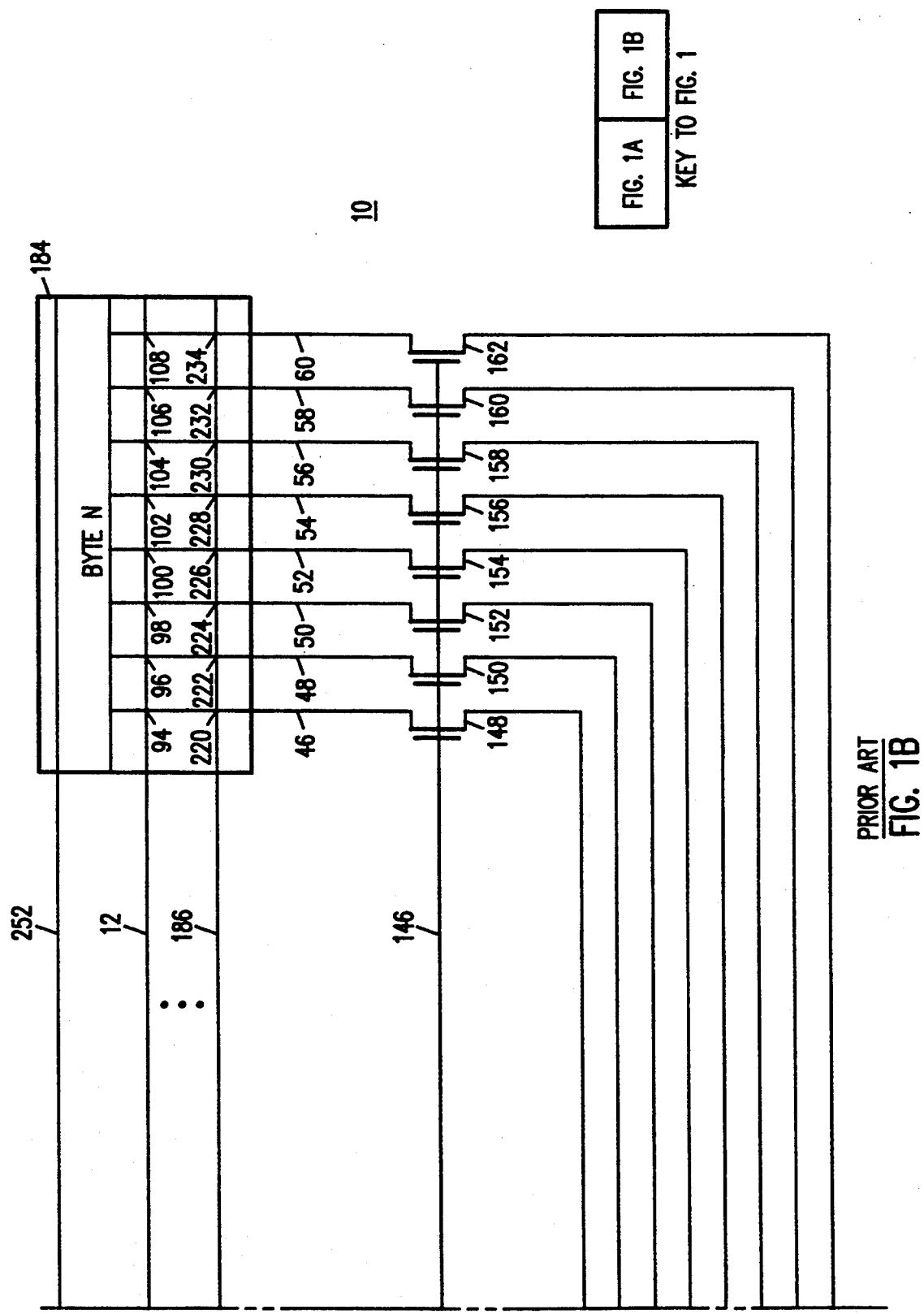
Figure 2:
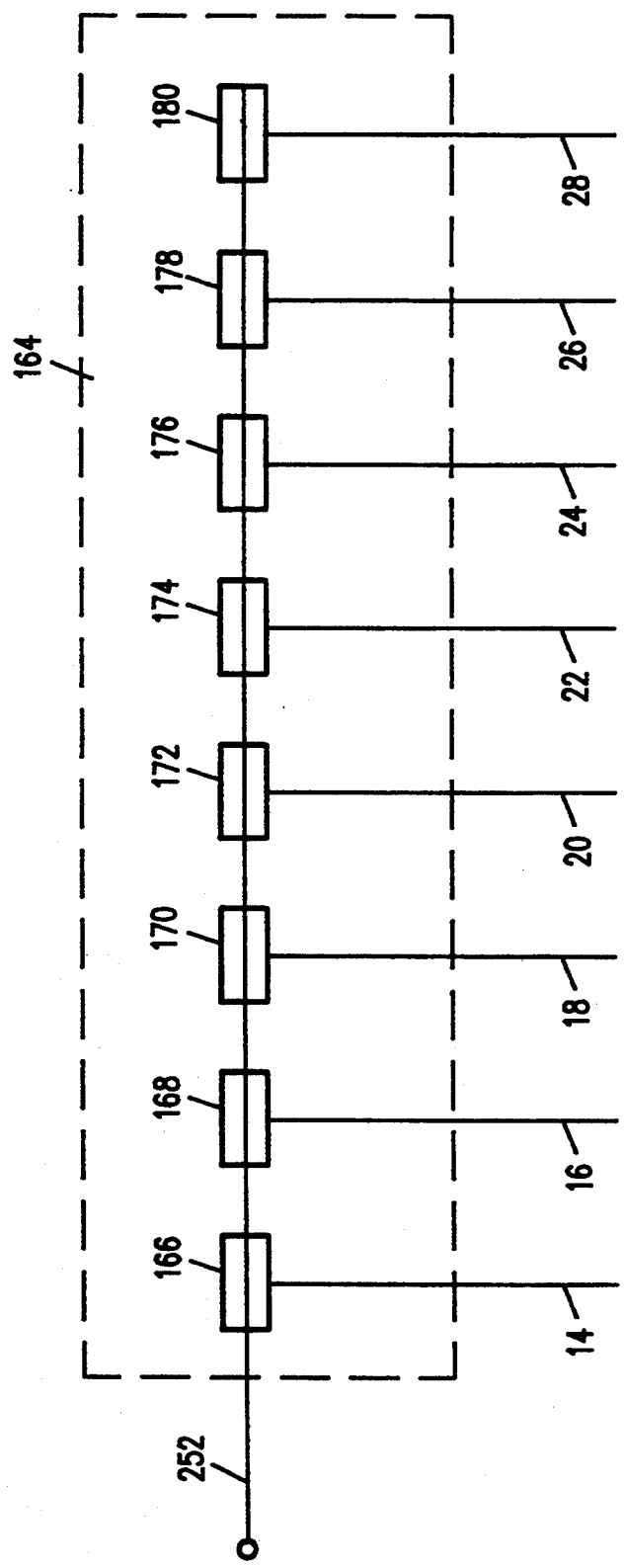
FIG. 2 is a layout drawing illustrating data latches within the byte latches of FIGS. 1A and 1B.
Figure 3A:
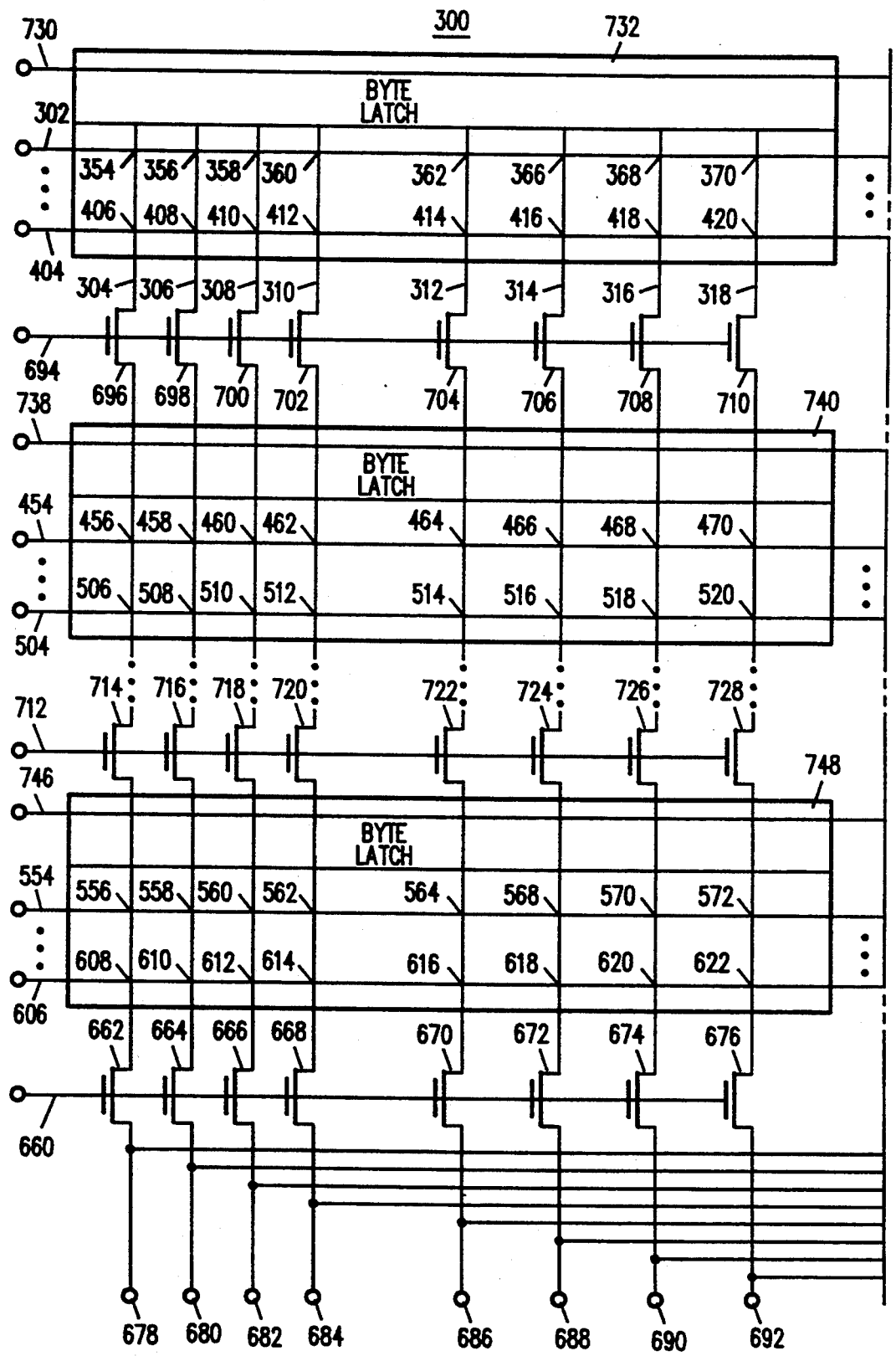
Figure 3B:
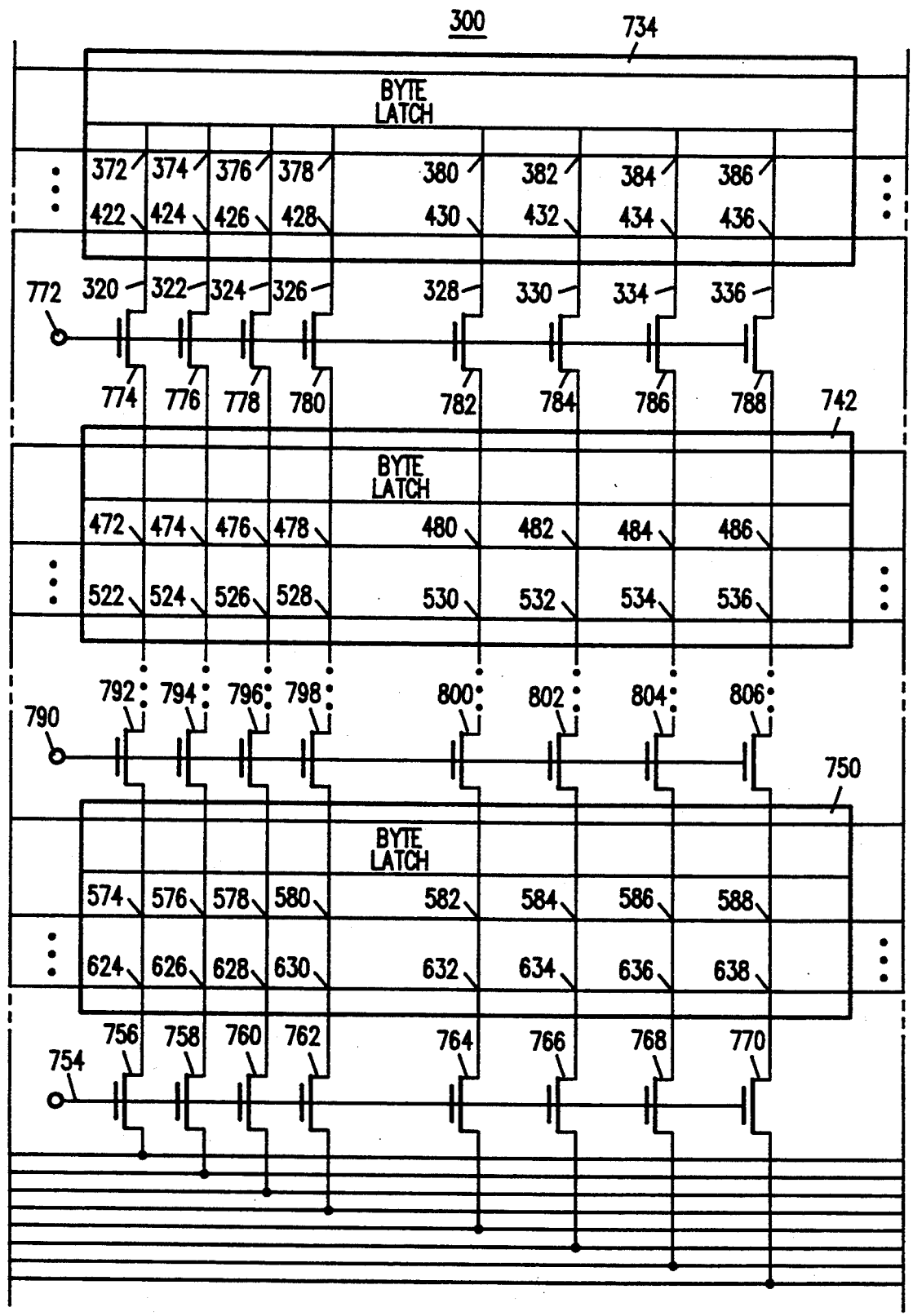

FIGS. 3A, 3B and 3C combine to show a memory array architecture 300 in accordance with the present invention. In comparison to the memory architecture 10 of FIGS. 1A and 1B, the memory 300 permits segmentation of a page into multiple word lines.

As further shown in FIGS. 3A–3C, the intersection of a word line 302 and a set of bit lines 304–318, 320–336 and 338–352 defines memory locations 354–370 (as a first byte), 372–386 (as a second byte) and 388–402 (as an Nth byte), respectively. Similarly, a word line 404 intersects the bit lines 304–318, 320–336 and 338–352 to form memory locations 406–420 (as a first byte), 422–436 (as a second byte), and 438–452 (as a Nth byte), respectively. Those skilled in the art will appreciate that although only two word lines 302 and 404 are illustrated, the bit lines 304–352 are typically associated with a plurality of word lines, generally groups of word lines with the group size being a power of two ($2^x$).

As further shown in FIGS. 3A–3C, a word line 454 intersects the bit lines 304–352 to form memory locations 456–502. A word line 504 intersects the bit lines 304–352 to form memory locations 506–552. Similarly, a word line 554 intersects the bit lines 304–352 to form memory locations 556–604. Similarly, a word line 606 intersects bit lines 304–352 to form memory locations 6()8–654.

In the operation of the array 300, in preparation for loading, a single read/load signal becomes active at all read/load lines 694, 712, 772, 790, 824 and 842 to thereby turn on all switch transistors 696–710, 714–728, 774–788, 792806, 826–840 and 844–858, respectively. Thus, the bit lines 304–352 form continuous columns under these conditions. Then a column-select signal applied to column-select line 660 turns on column-select transistors 662–676 to thereby connect bit lines 304–318 to input/output lines 678–692, respectively.

When data are provided to the input/output lines 678–692, a load signal is then provided to strobe line 730 to thereby simultaneously strobe byte latches 732, 734 and 736. As detailed further herein, since a column-select signal is present only at column-select line 660, a column-select gate ensures that data from the input/output lines 678–692 are loaded only into the byte latch 732. After the byte latch 732 has been loaded, a load signal is applied to strobe line 738 to load data then at the input/output lines 678–692 into the byte latch 740. This process continues until a load signal is applied to the strobe line 746 to thereby load into byte latch 748 the data at the input/output lines 678–692. Once byte latches 732, 740 and 748, and any byte latches between latches 740 and 748 are loaded, the column-select signal is removed from column-select line 660 and instead applied to column-select line 754. This causes the transistors 756–770 to connect the input/output lines 678–692 to the bit lines 320–336. As with the byte latches 732, 740 and 748, the byte latches 734, 742 and 750 are loaded by sequentially applying a load signal to strobe lines 730, 738 and 746, respectively, to thereby load data provided at the input/output lines 678–692. This sequence continues until the column-select signal is finally provided to the column-select line 808 to turn on transistors 810–822, thereby connecting bit lines 338–352 to input/output lines 678–692, respectively. At that point, the byte latches 736, 744 and 752 are loaded by sequentially applying a load signal to strobe lines 730, 738 and 746, respectively, to thereby load data sequentially provided at the input/output lines 678–692.

Once all of the data latches 732–736, 740–744 and 748–752 have been loaded, the read/load signal becomes inactive at all read/load lines 694, 712, 772, 790, 824 and 842, thereby segmenting bit lines 304–352 into multiple page segments. In further detail, once the read/load signal becomes inactive, the switches 696–710 and 714–728 each segment bit lines 304–318. Similarly, switches 774–788 and 792–806 each segment bit lines 320–336. In addition, switches 826840 and 844–858 each segment bit lines 338–352.

With bit lines 304–352 segmented between their respective byte latches, the word lines 302, 454 and 554 may simultaneously selected for programming. Thus, memory locations 354–402, 456–502 and 556–604 may be simultaneously programmed with data from their corresponding byte latches.

The above described sequence is then repeated for each additional desired set of word lines. For example, after all of byte latches 732–736, 740–744 and 748–752 have again been loaded, and the read/load signal becomes inactive, the word lines 404, 504 and 606 are simultaneously selected for programming. Memory locations 406–452, 506–552 and 608–654 are thus programmed with data from their corresponding byte latches. This method and memory arrangement effectively amortizes the program time over many bytes, thereby resulting in a small average program time per byte.

During a read operation, the read/load signal becomes active on all of the read/load lines 694, 712, 772, 790, 824 and 842 (and on any unshown read/load lines therebetween), thereby assuring that the bit lines 304–352 are not segmented. Under these conditions, the word lines 302, 404, 454, 504, 554 and 606 are independently and non-simultaneously selected (in association with their respective column-select lines 660, 754 and 808) in order to access any byte of data within a selected set of memory locations.

Thus, by utilizing switching transistors to segment bit line columns, the selection of page length for a memory of a given size is not limited.

Although only 9 byte latches, 6 word lines and 18 bytes of memory locations have been illustrated, it will be clear to those skilled in the art that the bit line segmenting concepts of the present invention described above may be used with other quantities of byte latches and memory locations.

It should be understood that various alternatives to the embodiments of the invention described herein may be employed in practicing the invention. It is intended that the following claims define the scope of the invention and that methods and structures within the scope of these claims and their equivalents be covered thereby.

I claim:

1. A semiconductor memory array that includes a plurality of bit lines disposed in a first direction and a plurality of word lines disposed in a second direction transverse to the first direction such that each of the word lines overlaps each of the bit lines, a data storage cell being associated with each overlap of a word line and a bit line to define a plurality of rows and a plurality of columns of such data storage cells, the plurality of bit lines being subdivided into a plurality of groups of bit lines, each bit line group including at least one bit line, the semiconductor memory array comprising:

for each bit line group, each bit line in said bit line group including switching means that responds to an inactive read/load signal by segmenting each said bit line into a plurality of electrically isolated bit line segments, each bit line segment having at least one data storage cell associated therewith, said switching means responding to an active read/load signal by electrically connecting each of said bit line segments;

for each of said bit line segments in a bit line group, a data latch associated therewith, each data latch responding to an active strobe signal by loading data provided at inputs to said data latch;

a plurality of input lines; and for each bit line group, column-select switching means connected between said plurality of input lines and said bit lines of said bit line group and that responds to an active column-select signal by electrically connecting said input lines to said bit lines such that data provided on said input lines is provided at the inputs of said data latches associated with said bit line group, whereby said data is loaded into said data latch of said bit line group having an active strobe signal applied thereto.

2. A method of storing data within a memory array formed in a silicon substrate, the array including a cell matrix defined by a plurality of rows and a plurality of columns of data storage cells, comprising the steps of:

connecting bit line segments within a column in response to a read/load signal;

loading data into a plurality of page latches;

disconnecting each bit line segment within the column in response to the absence of said read/load signal;

simultaneously transferring the data from each page latch to a respective set of data storage cells; and connecting bit line segments within each column in response to said read/load signal.

* * * * *